(12) United States Patent

Kim et al.

(10) Patent No.: US 12,581,922 B2

(45) Date of Patent: Mar. 17, 2026

(54) METHOD FOR FORMING A HIGH RESISTIVITY HANDLE SUPPORT FOR COMPOSITE SUBSTRATE

(71) Applicant: Soitec, Bernin (FR)

(72) Inventors: Young-Pil Kim, Grenoble (FR); Isabelle Bertrand, Bernin (FR); Christelle Veytizou, Bernin (FR)

(73) Assignee: Soitec, Bernin (FR)

( * ) Notice: Subject to any disclaimer, the term of this patent is extended or adjusted under 35 U.S.C. 154(b) by 746 days.

(21) Appl. No.: 17/755,812

(22) PCT Filed: Nov. 25, 2020

(86) PCT No.: PCT/EP2020/083379

§ 371 (c)(1),
(2) Date: May 9, 2022

(87) PCT Pub. No.: WO2021/110513

PCT Pub. Date: Jun. 10, 2021

(65) Prior Publication Data

US 2022/0399200 A1      Dec. 15, 2022

(30) Foreign Application Priority Data

Dec. 5, 2019     (FR) ...................................... 1913781

(51) Int. Cl.
H01L 21/02          (2006.01)
H01L 21/762         (2006.01)
(Continued)

(52) U.S. Cl.
CPC .. H01L 21/02002 (2013.01); H01L 21/76254 (2013.01); H10N 30/072 (2023.02); H10N 30/88 (2023.02)

(58) Field of Classification Search
None
See application file for complete search history.

(56) References Cited

U.S. PATENT DOCUMENTS

| | | |
|---|---|---|
| 4,855,254 A | 8/1989 | Eshita et al. |
| 5,296,258 A | 3/1994 | Tay et al. |
| | (Continued) | |

FOREIGN PATENT DOCUMENTS

| | | |
|---|---|---|
| CN | 102640278 A | 8/2012 |
| CN | 109155276 A | 1/2019 |
| | (Continued) | |

OTHER PUBLICATIONS

Chinese First Notification of Office Action for Application No. 202080072021.8 dated Feb. 20, 2025, 10 pages.

(Continued)

*Primary Examiner* — Brent A. Fairbanks
*Assistant Examiner* — Derek L Nielsen
(74) *Attorney, Agent, or Firm* — TraskBritt

(57) ABSTRACT

A method for forming a high resistivity handle substrate for a composite substrate comprises: providing a base substrate made of silicon; exposing the base substrate to a carbon single precursor at a pressure below atmospheric pressure to form a polycrystalline silicon carbide layer having a thickness of at least 10 nm on the surface of the base substrate; and then growing a polycrystalline charge trapping layer on the carbon-containing layer.

20 Claims, 2 Drawing Sheets

(51) Int. Cl.
    *H10N 30/072* (2023.01)
    *H10N 30/88* (2023.01)

(56) References Cited

U.S. PATENT DOCUMENTS

| | | | |
|---|---|---|---|
| 2017/0221705 A1 | 8/2017 | Matsuo et al. | |
| 2018/0114720 A1* | 4/2018 | Wang ................ | H01L 21/02381 |
| 2018/0330983 A1* | 11/2018 | Wang ................ | H01L 21/02532 |

FOREIGN PATENT DOCUMENTS

| | | | |
|---|---|---|---|
| CN | 110178211 | A | 8/2019 |
| JP | 01-162326 | A | 6/1989 |
| JP | 2010-225733 | A2 | 10/2010 |
| JP | 2013-513234 | A | 4/2013 |
| JP | 2019-536260 | A | 12/2019 |
| KR | 1992-0004173 | B1 | 5/1992 |
| KR | 10-2012-0087188 | | 8/2012 |

| | | | |
|---|---|---|---|
| WO | 2017/114821 | A1 | 8/2017 |
| WO | 2019/002376 | A1 | 1/2019 |
| WO | 2020/128354 | A1 | 6/2020 |

OTHER PUBLICATIONS

Korean Office Action for Application No. 10-2022-7023105 dated Oct. 11, 2024, 12 pages with machine translation.

Taiwanese Office Action for Application No. 11221253850 dated Dec. 12, 2023, 7 pages with English Translation.

Japanese Notice of Reasons for Rejection for Application No. 2022-528307 dated Sep. 24, 2024, 9 pages.

International Search Report for International Application No. PCT/EP2020/083379 dated Feb. 24, 2021, 3 pages.

International Search Report for International Application No. PCT/EP2020/083379 dated Feb. 24, 2021, 6 pages.

International Written Opinion for International Application No. PCT/EP2020/083379, mailed Feb. 24, 2021, 6 pages.

\* cited by examiner

METHOD FOR FORMING A HIGH RESISTIVITY HANDLE SUPPORT FOR COMPOSITE SUBSTRATE

CROSS-REFERENCE TO RELATED APPLICATIONS

This application is a national phase entry under 35 U.S.C. § 371 of International Patent Application PCT/P2020/083379, filed Nov. 25, 2020, designating the United States of America and published as International Patent Publication WO 2021/110513 A1 on Jun. 10, 2021, which claims the benefit under Article 8 of the Patent Cooperation Treaty to French Patent Application Serial No. FR1913781, filed Dec. 5, 2019.

TECHNICAL FIELD

The present disclosure relates to a high resistivity handle for a composite substrate. It also relates to a method for forming such a handle substrate.

BACKGROUND

International Patent Application WO2017144821 describes a high resistivity handle substrate for a composite substrate comprising a charge-trapping layer disposed on a base substrate. The composite substrate may be, for instance, a silicon on insulator substrate comprising a silicon thin film transferred onto the handle substrate.

In one embodiment described in the aforementioned document, the charge-trapping layer is made of an intermediate layer and of a polycrystalline main layer. The intermediate layer comprises a silicon and carbon alloy (or of carbon) and is disposed directly on the base substrate. The main layer is disposed on, and in contact with, the intermediate layer.

The multilayer structure of the charge trapping layer makes it possible to prevent the phenomenon of recrystallization of the main polycrystalline layer when the substrate is exposed to a high temperature, for example, during its manufacture or during the manufacture of integrated devices on the composite substrate. When the trapping layer recrystallizes, even partially, the RF (Radio Frequency) performances of the substrate and of the integrated devices that will be formed thereon are affected, which is, of course, not desirable.

To prepare the high resistivity handle substrate, the document proposes to place the base substrate in a conventional deposition chamber. A flow of a first precursor gas travels through the chamber. The first precursor gas may be a silicon containing precursor, for example, $SiH_4$, to grow the main polycrystalline layer. A second precursor gas comprising carbon is introduced into the chamber to form the intermediate layer. This precursor gas may comprise methane ($CH_4$), ethane ($C_2H_6$), propane ($C_3H_8$), acetylene ($C_2H_2$), ethylene ($C_2H_4$), etc.

When the two precursor gases flow simultaneously into the chamber to grow the intermediate silicon and carbon alloy layer, there is a risk of forming deposit on the chamber walls and on the susceptor onto which the base substrate resides. Such deposits require extensive cleaning of the chamber, for instance, by etching, which is time consuming and reduces manufacturing throughput. Such a problem is documented, for instance, in the International Patent Application WO2019002376. Also, deposits of silicon and carbon species may create particles that may be transported onto the base substrate or handle substrate surfaces, and render the substrate unsuitable for further use.

It has also been observed that doping species, like boron, could be incorporated into the intermediate layer and/or main layer, in particular, when the base substrate is a standard CZ silicon substrate (i.e., not designed to exhibit high resistivity characteristics). Such CZ silicon substrates comprises some residual concentration of boron and other dopants, which may migrate toward the base wafer surface during growth of the charge trapping layer. When present in the charge trapping layer, the dopant reduces the resistivity of that layer and the overall RF performance of the handle substrate.

BRIEF SUMMARY

The present disclosure aims to overcome all or some of the aforementioned drawbacks. It aims, in particular, to provide a method for forming a handle substrate exhibiting high resistivity characteristics and being easy to manufacture.

With a view to achieving this aim, the present disclosure proposes a method for forming a high resistivity handle substrate for a composite substrate, the method comprising:

- providing a base substrate made of monocrystalline silicon;
- exposing the base substrate to a single carbon precursor at a pressure below atmospheric pressure to form a polycrystalline silicon carbide layer having a thickness of at least 10 nm on the surface of the base substrate; and then
- growing a polycrystalline charge trapping layer on the polycrystalline silicon carbide layer.

According to other advantageous and non-limitative features of the present disclosure, taken alone or in any technically achievable combination:

- the base substrate has a resistivity higher than 1000 ohm·cm;
- the base substrate has a resistivity lower than 1000 ohm·cm;
- the method further comprises forming a silicon intrinsic epitaxial layer directly on the base substrate before exposing the base substrate to the single carbon precursor;
- the charge trapping layer has a thickness greater than 5 microns, or even greater than 10 microns;
- the charge trapping layer is made of polycrystalline silicon;
- the single carbon precursor exhibits a temperature between 700° C. and 1200° C.;
- the method further comprises exposing the base substrate to a reducing atmosphere at a temperature of at least 900° C. to remove a native oxide layer from the base substrate, before exposing the base substrate to the single carbon precursor; and
- the polycrystalline silicon carbide layer is stoichiometric.

According to another aspect, the present disclosure also relates to a high resistivity handle substrate for a composite substrate comprising:

- a base substrate made of monocrystalline silicon;
- a polycrystalline silicon carbide layer having a thickness of at least 10 nm directly on the surface of the base substrate; and
- a polycrystalline charge trapping layer on the polycrystalline silicon carbide layer.

Optionally, the polycrystalline silicon carbide layer may comprise a concentration of dopant less than $10^{14}$ at/cm$^3$, and the high resistivity handle substrate may further comprise a silicon intrinsic epitaxial layer in contact with the base substrate and with the polycrystalline silicon carbide layer. The polycrystalline silicon carbide layer is stoichiometric.

Finally, the present disclosure also relates to a composite substrate comprising a high resistivity handle substrate as previously described, and, on top of the handle substrate, a thin film made of crystalline material.

Advantageously, the composite substrate further comprises a dielectric layer disposed between the handle substrate and the thin film.

BRIEF DESCRIPTION OF THE DRAWINGS

Other features and advantages of the present disclosure will emerge from the detailed description of the present disclosure that follows with reference to the accompanying figures, in which.

DETAILED DESCRIPTION

Figure 1:
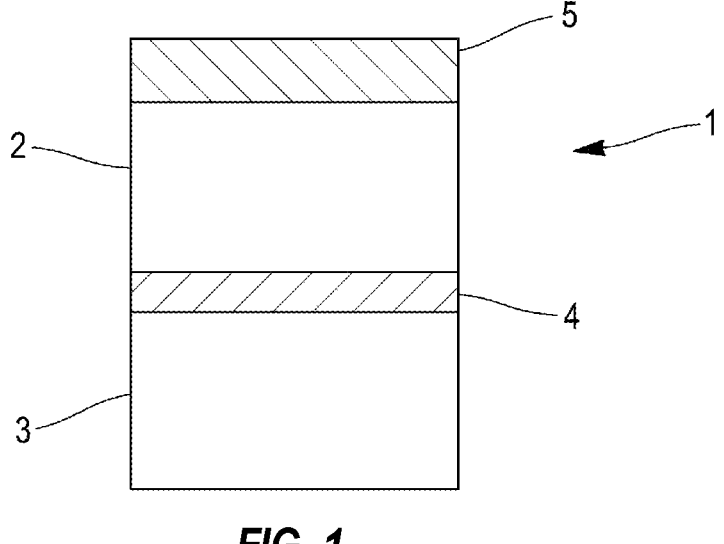
FIG. 1 schematically illustrates a handle substrate for a semiconductor structure according to the present disclosure.

FIG. 1 schematically illustrates a high resistivity handle support for a composite substrate according to an embodiment of the present disclosure. The handle substrate 1 may be in the form of a circular wafer, of standardized size, for example, 200 mm or 300 mm, or even 450 mm in diameter. However, the present disclosure is in no way limited to these dimensions or to this form.

The handle substrate 1 comprises a monocrystalline silicon base substrate 3, typically several hundreds of microns thick. The silicon base substrate 3 exhibits a smooth surface, with a roughness below 0.5 nm RMS. Preferentially, the silicon base substrate 3 has high resistivity greater than 1000 ohm·cm, and preferably greater than 3000 ohm·cm. In this way, the density of the charges, holes or electrons that are liable to move in the base substrate 3 is limited. The base substrate 3 may be, for example, a CZ substrate with a small interstitial oxygen content that has, as is well known per se, a resistivity that may be greater than 500 ohm·cm or even greater than 1000 ohm·cm.

However, the present disclosure is not limited to a silicon base substrate having such a resistivity, and also procures advantages in RF performances when the base substrate has a more usual resistivity, around a few hundreds of ohm·cm or less, for instance, less than 1000 ohm·cm, less than 500 ohm·cm, or even less than or equal to 10 ohm·cm.

When the base substrate 3 has a more usual resistivity of less than 1000 or 500 ohm·cm, it may be advantageous to provide a silicon intrinsic epitaxial layer disposed directly on top of the base substrate 3. By "intrinsic" it is meant that this layer is not intentionally doped. The silicon epitaxial layer is grown to present in this case a resistivity higher than 2000 ohm·cm, and preferably between 2000 ohm·cm and 20000 ohm·cm. The epitaxial layer has a thickness typically ranging from 2 to 100 microns. This approach is particularly advantageous when the base substrate is made of silicon, as it provides a substrate with appropriate surface resistivity, without the drawback in terms of cost and availability associated with base substrates that exhibit a high resistivity across their total thickness.

The handle substrate 1 also comprises, on the base substrate 3, a polycrystalline charge trapping layer 2. The function of the charge trapping layer 2 is to trap any charge carriers that may be present in the handle substrate 1 and to limit the mobility thereof.

For reasons of availability and cost, the charge trapping layer 2 is preferably made from polycrystalline silicon. However, it may be formed from another semiconductor and polycrystalline material, or comprise a part made from another semiconductor and polycrystalline material. In some embodiments, the charge trapping layer 2 may comprise, for example, germanium, silicon germanium, etc.

In all cases, the polycrystalline charge trapping layer 2 has a high resistivity, typically above 3000 ohm·centimeter. For this purpose, this layer is not intentionally doped, which is to say it has a concentration of dopants of less than $10^{14}$ at/cm$^3$. The charge trapping layer 2 may be rich in nitrogen or carbon in order to increase the resistivity of the charge trapping layer 2.

The high resistivity handle substrate 1 also comprises, interposed between the base substrate 3 and the polycrystalline charge trapping layer 2, a polycrystalline silicon carbide layer 4 having a thickness of at least 10 nm. Such a thickness of silicon carbide forms an efficient barrier against the diffusion of dopants, such as boron, that may be contained in the base substrate 3. This layer 4 typically exhibits a resistivity above 1000 ohm·centimeters. By "silicon carbide layer." it is meant that the silicon and carbon species forming the layer are present in stoichiometric or close to stoichiometric proportion in the layer.

The high resistivity handle substrate 1 thus comprises the base substrate 3 (optionally comprising a top silicon intrinsic epitaxial layer), the polycrystalline silicon carbide layer 4 directly in contact with the base substrate 3, and the polycrystalline charge trapping layer 2 on, and directly in contact with, the polycrystalline silicon carbide layer 4. Provision is not made, in this particular embodiment, for incorporating other layers, in particular, electrically insulating layers in or below the polycrystalline charge trapping layer 2, which might modify the properties of the proposed structure.

The polycrystalline charge trapping layer 2 may have a thickness greater than 1 micron, greater than 5 microns, or even greater than 10 microns. Whether its thickness is greater or lesser than these values, the charge trapping layer 2 may comprise grains with a size of between 100 and 1000 nanometers.

Finally, and as shown in FIG. 1, the handle substrate 1 may optionally have a dielectric layer 5 directly on the charge trapping layer 2. This dielectric layer 5, which is optional, may facilitate the assembly of the handle substrate 1 with another substrate. The dielectric layer 5 may, for example, be made of silicon oxide or silicon nitride.

Figure 2:
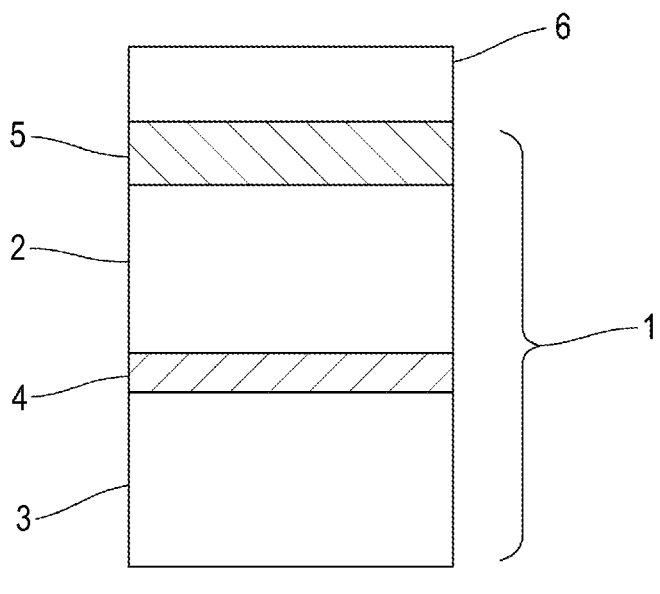
FIG. 2 schematically illustrates a composite substrate using a handle substrate according to the present disclosure.

For the sake of completeness, FIG. 2 represents a composite substrate that comprises a handle substrate 1 according to the present disclosure. As illustrated in FIG. 2, the composite substrate comprises, on top of the handle substrate 1, a thin film 6, made preferably of crystalline material. For instance, and without limitation, thin film 6 may be made of semiconductor material, such as silicon, or made of piezoelectric material, such as lithium tantalate (LiTaO$_3$), lithium niobate (LiNbO$_3$), lithium aluminum oxide (LiAlO$_3$), barium titanate (BaTiO$_3$), lead zirconate titanate (PbZrTiO$_3$), potassium niobite (KNbO$_3$), barium zirconate (BaZrO$_3$), calcium titanate (CaTiO$_3$), lead titanate (PbTiO$_3$), potassium tantalite (KTaO$_3$), etc.

The structure of FIG. 2 may be formed in many ways from the handle substrate 1, but advantageously this formation comprises a step of transferring the thin film 6 onto the handle substrate 1. As it is well known per se, this transfer is usually carried out by assembling the face of a donor substrate on the handle substrate 1. This may be performed with the presence of the dielectric layer 5 or without the presence of the dielectric layer 5.

When the thin film 6 is made of piezoelectric material, its crystal orientation is chosen according to the intended application. For SAW filters made of LiTaO$_3$ material, it is usual to choose an orientation between 30° and 60° XY, or between 40° and 50° XY. For LiNbO$_3$ material, it is common to choose an orientation around 128° XY. But the present disclosure is by no means limited to a particular crystal orientation of a piezoelectric thin film. The donor substrate may have been taken off from an ingot of ferroelectric materials such that the donor substrate exhibits the chosen crystal orientation. Alternatively, the donor substrate may include a thick layer of ferroelectric material assembled to a support substrate.

After this assembly step, the donor substrate is reduced in thickness in order to form the thin film 6. This reduction step can be carried out by mechanical or chemical thinning. The reduction step may also be performed by fracture at a fragile zone previously introduced into the donor substrate, for example, in accordance with the principles of the Smart Cut™ technology.

Steps for finishing the thin film 6, such as a polishing step, a heat treatment under reducing or neutral atmosphere or a sacrificial oxidation can be concatenated with the step of reduction in thickness.

When the donor substrate is a simple substrate, which is to say, does not comprise any integrated device, a composite substrate of the "semiconductor on insulator" type is formed, in which the thin film 6 is a layer of blank semiconductors, comprising the handle substrate 1 of the present disclosure. The composite substrate can then be used for forming integrated devices.

When the donor substrate has been previously treated in order to form integrated devices on a surface of the donor substrate, at the end of this method, a thin film 6 that comprises these devices is provided.

Manufacturing of the handle substrate 1 of the present disclosure is particularly simple and achievable with standard deposition equipment of the industry.

The base substrate 3 is provided and placed in a conventional deposition chamber. As it is well known per se, the base substrate 3 may be prepared before deposition, for example, in order to eliminate a layer of native oxide from a surface of the base substrate 3. This can be performed by exposing the base substrate 3 in the chamber to a reducing atmosphere at a temperature of at least 900° C. This step is, however, not obligatory and this oxide may be kept. It is in fact sufficiently fine, from 1 to 2 nm, not to have any insulating effect (conduction through this layer occurring by the tunneling phenomenon) insofar as future heat treatments have not made it completely disappear by dissolution.

The flat surface of the silicon base substrate 3 is then exposed to a single carbon precursor gas at a pressure below atmospheric pressure, for instance, between 0.01 Torr and 760 Torr. The carbon precursor gas may comprise methane (CH$_4$), ethane (C$_2$H$_6$), propane (C$_3$H$_8$), acetylene (C$_2$H$_2$), ethylene (C$_2$H$_4$), etc. The precursor gas may be flown into the chamber (or heated within the chamber) at a temperature between 700° C. and 1200° C., such that carbon species nucleate onto the base substrate surface. A flow of transport gas (such as H$_2$) may also be introduced simultaneously into the chamber, but no other precursor gas than the carbon precursor gas is flown over the base substrate 3. By avoiding the reaction of the carbon species to react with other species of a second precursor, deposition of a carbon compound on the chamber wall is limited, and generation of particles is avoided.

It has been surprisingly observed that when this deposition step is performed under reduced carbon partial pressure (i.e., below atmospheric pressure), this nucleation of the carbon species is performed on isolated islands on the surface. Silicon atoms from the base wafer then diffuse into the carbon islands, forming stoichiometric or close to stoichiometric silicon carbide islands of the 3C/6H and 4H types. The islands coalesce to form a relatively thick polycrystalline silicon carbide layer, of stoichiometric or close to stoichiometric proportion. When the flow of carbon precursor gas is maintained for a couple of minutes, the thickness of the polycrystalline layers grows to multiple nanometers.

In a particular example, a carbon precursor gas of C$_3$H$_8$ mixed with H$_2$ in a proportion of 180 sccm/5 slm is introduced and flown for 5 minutes at a pressure of 10 torr in the chamber and heated at 1000° C. A polycrystalline layer 4 of silicon carbide having a thickness of 10 nm was then observed on the surface of the silicon base substrate 3.

When the deposition step is performed at or above atmospheric pressure, such as documented in International Patent Application WO2019002376 cited in the Background, a completely different phenomenon takes place on the surface of the base substrate 3. The carbon species nucleate with a higher density on the surface of the base wafer and block the diffusion of the silicon atoms from that surface. A crystalline or partly crystalline carbon layer then grows slowly on the surface, aligned with the silicon lattice, in a 3C structure. Such a layer typically has a thickness of 2 nm after 10 minutes of deposition.

It appears therefore that flowing a single carbon precursor gas at reduced pressure over the base substrate 3 is a very effective way of forming a relatively thick (greater than or equal to 10 nm) layer of polycrystalline silicon carbide. Such a layer is advantageous because, thanks to its polycrystalline nature, it allows formation and preservation of the polycrystalline nature of the charge trapping layer that is grown on top of the polycrystalline layer 4. Also, the relatively large thickness of the silicon carbide polycrystalline layer 4 is formed quite rapidly, and constitutes an effective diffusion barrier to avoid the migration of dopant species from the base substrate 3 to the charge trapping layer 2.

In addition, it has been observed that such a growth method, under reduced pressure, was incorporating very few dopants (like boron) in the silicon carbide intermediate layer 4. Measures have shown a concentration of boron less than 10$^{14}$ at/cm$^3$ into such a silicon carbide layer 4. It is believed that the dopant species (that may be present on the surface of the base wafer or incorporated into the base wafer) are diffused out from the silicon carbide layer 4 during its formation and evacuated from the deposition chamber with the precursor and transport gas.

After the silicon carbide polycrystalline layer 4 has been grown onto the base substrate 2, the chamber has a flow of a second precursor gas travel through it, for example, SiH$_4$, at a temperature of around 1000° C., in order to form a polycrystalline charge trapping layer 2, in a conventional manner. The duration of circulation of the second precursor gas determines the thickness of the polycrystalline charge trapping layer 2, and this duration may be selected such that a layer of 5 microns, 10 microns or more is grown.

Advantageously, the silicon carbide polycrystalline layer and the polycrystalline charge trapping layer are formed in situ, in the same deposition chamber. This avoids contaminating the stack of layers with dopants or contaminants from the atmosphere, and preserves the high resistivity characteristics of the handle substrate 1.

To be complete, the handle substrate 1 may be provided with a dielectric layer 5, for example, a silicon oxide or silicon nitride, deposited conventionally. This insulator 5 may also be polished.

When the base substrate 3 is provided with a silicon intrinsic epitaxial layer, the formation of this layer may be realized in-situ with the formation of the silicon carbide polycrystalline layer 4. This approach avoids breaking the vacuum in the deposition chamber and thus improves the raw processing time and overall method efficiency. It also prevents the handle substrate from contamination by the ambient atmosphere, such as by particles or boron residues that may be present in the cleanroom. The two layers may also be formed in separate deposition chambers, but the chambers sharing a common transfer module. In addition to the advantage already cited, this approach of using separate chambers allows a better management of the required cleanings of the chambers. Obviously, it also possible to form the two layers in completely separate chambers.

Figure 3:
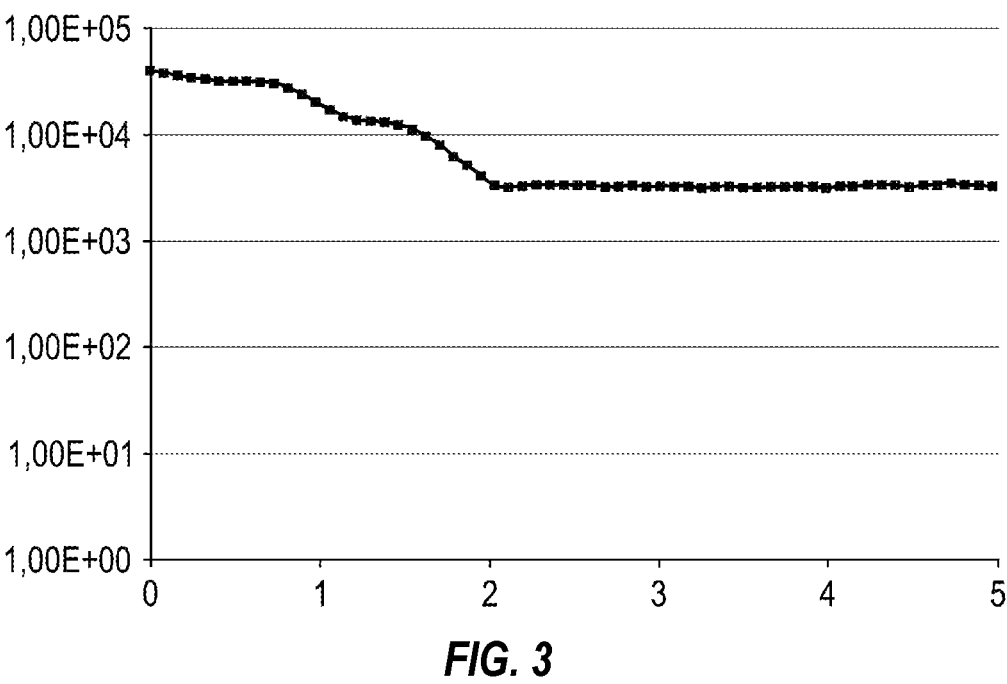
FIGS. 3 and 4 are respective spreading resistance profile (SRP) measurements for two handle substrates.

To show the benefit of the manufacturing method, FIG. 3 illustrates a SRP measurement (spreading resistance profile) along the depth of a handle wafer according to the present disclosure. In that particular measurement, the base wafer 3 was a high resistivity silicon wafer (having a resistivity of 3500 ohm·cm), onto which a silicon carbide polycrystalline layer 4 having a thickness of 10 nm, and a silicon polycrystalline charge trapping layer 2 having a thickness of 2 microns were successively grown. As seen in FIG. 3, the resistivity of the layers grown on top of the base substrate 3 exhibit a resistivity greater than 3500 ohm·cm for its complete depth profile.

Figure 4:
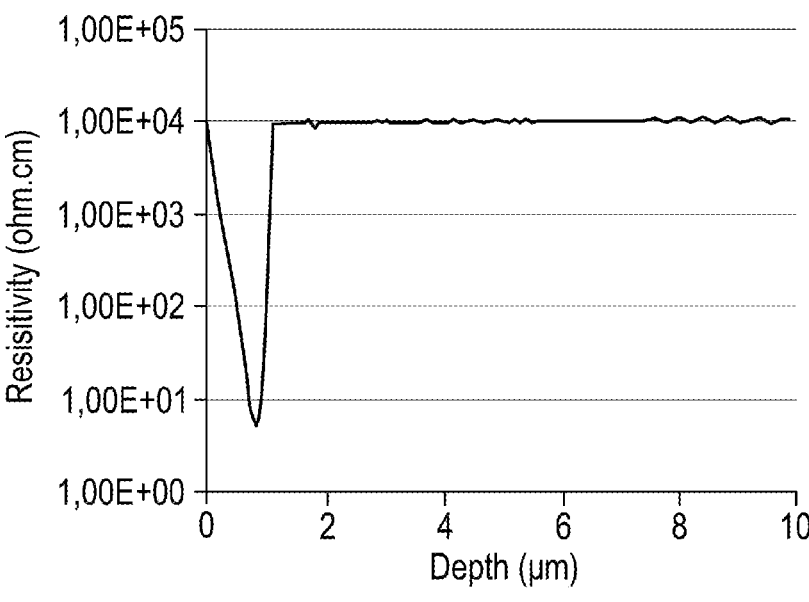

FIG. 4 represents a SRP measurement of a handle wafer made of a base substrate 3 exhibiting a resistivity of 4000 ohm cm. On top of this substrate 3, a carbon layer having a thickness of 2 nm, formed at atmospheric pressure and therefore mostly crystalline, and a silicon polycrystalline charge trapping layer 2 having a thickness of 2 microns were successively grown. It is apparent from FIG. 4 that the resistivity of the layers grown on top of the base substrate 3 is reaching a low value at and close to the interface with the base substrate (less than 10 ohm·cm). Such a poor resistivity is due to formation of a conductive plane in the handle substrate, which affects the performance of the devices.

This comparative example clearly shows the interest of exposing the base substrate to a single carbon precursor at a pressure below atmospheric pressure.

Of course, the present disclosure is not limited to the embodiment described and variants of realization can be made without going beyond the scope of the invention as defined by the claims.

The invention claimed is:

1. A method for forming a high resistivity handle substrate for a composite substrate, the method comprising:

providing a base substrate comprising monocrystalline silicon;

exposing the base substrate to a single carbon species precursor gas free of silicon precursors at a pressure below atmospheric pressure to form a polycrystalline silicon carbide layer having a thickness of at least 10 nm on the surface of the base substrate; and then growing a polycrystalline charge trapping layer on the polycrystalline silicon carbide layer.

2. The method of claim 1, wherein the base substrate has a resistivity higher than 1000 ohm·cm.

3. The method of claim 1, wherein the base substrate has a resistivity lower than 1000 ohm·cm.

4. The method of claim 3, further comprising forming a silicon intrinsic epitaxial layer directly on the base substrate before exposing the base substrate to the single carbon species precursor gas.

5. The method of claim 4, wherein the charge trapping layer has a thickness greater than 5 or 10 microns.

6. The method of claim 5, wherein the charge trapping layer comprises polycrystalline silicon.

7. The method of claim 6, wherein the single carbon species precursor gas exhibits a temperature between 700° C. and 1200° C.

8. The method of claim 7, further comprising exposing the base substrate to a reducing atmosphere at a temperature of at least 900° C. and removing a native oxide layer from the base substrate before exposing the base substrate to the single carbon species precursor gas.

9. The method of claim 8, wherein the polycrystalline silicon carbide layer is stoichiometric.

10. The method of claim 2, further comprising forming a silicon intrinsic epitaxial layer directly on the base substrate before exposing the base substrate to the single carbon species precursor gas.

11. The method of claim 10, wherein the charge trapping layer has a thickness greater than 5 or 10 microns.

12. The method of claim 11, wherein the charge trapping layer comprises polycrystalline silicon.

13. The method of claim 1, wherein the single carbon species precursor gas exhibits a temperature between 700° C. and 1200° C.

14. The method of claim 13, further comprising exposing the base substrate to a reducing atmosphere at a temperature of at least 900° C. and removing a native oxide layer from the base substrate before exposing the base substrate to the single carbon species precursor gas.

15. The method of claim 14, wherein the polycrystalline silicon carbide layer is stoichiometric.

16. The method of claim 1, further comprising forming a silicon intrinsic epitaxial layer directly on the base substrate before exposing the base substrate to the single carbon species precursor gas.

17. The method of claim 1, wherein the charge trapping layer has a thickness greater than 5 microns.

18. The method of claim 1, wherein the charge trapping layer comprises polycrystalline silicon.

19. The method of claim 1, further comprising exposing the base substrate to a reducing atmosphere at a temperature of at least 900° C. and removing a native oxide layer from the base substrate before exposing the base substrate to the single carbon species precursor gas.

20. The method of claim 1, wherein the polycrystalline silicon carbide layer is stoichiometric.

* * * * *